United States Patent
Ulmer et al.

[11] Patent Number: 5,249,214
[45] Date of Patent: Sep. 28, 1993

[54] LOW SKEW CMOS CLOCK DIVIDER

[75] Inventors: Richard W. Ulmer, Tempe; James Ward, Gilbert, both of Ariz.

[73] Assignee: VLSI Technology, Inc., San Jose, Calif.

[21] Appl. No.: 907,252

[22] Filed: Jun. 30, 1992

[51] Int. Cl.$^5$ .................................... H03K 21/36
[52] U.S. Cl. ........................... 377/121; 377/47; 377/48; 377/118
[58] Field of Search .................... 377/47, 48, 118, 121

[56] References Cited

U.S. PATENT DOCUMENTS

| | | | |
|---|---|---|---|
| 4,545,063 | 10/1985 | Kamimaru | 377/48 |
| 4,575,867 | 3/1986 | Hogue | 377/47 |
| 4,669,099 | 5/1987 | Zinn | 377/47 |
| 4,759,043 | 7/1988 | Lewis | 377/121 |

Primary Examiner—William L. Sikes
Assistant Examiner—Scott A. Ouellette
Attorney, Agent, or Firm—LaValle D. Ptak

[57] ABSTRACT

A low-skew CMOS clock divider circuit for providing tracking of the divide-by-one and divide-by-two output signals obtained from a source of master clock pulses is fabricated using two matched flip-flops externally wired as divide-by-two devices. Coincidence gates are coupled with the outputs of the flip-flops to produce the desired divide-by-one and divide-by-two output signals in a manner such that the signals in each path pass through substantially identical circuit components. Thus, any delays encountered are the same in both circuit paths. In this manner, skew between the edges of the divide-by-two and divide-by-one clock signals is significantly reduced.

15 Claims, 2 Drawing Sheets

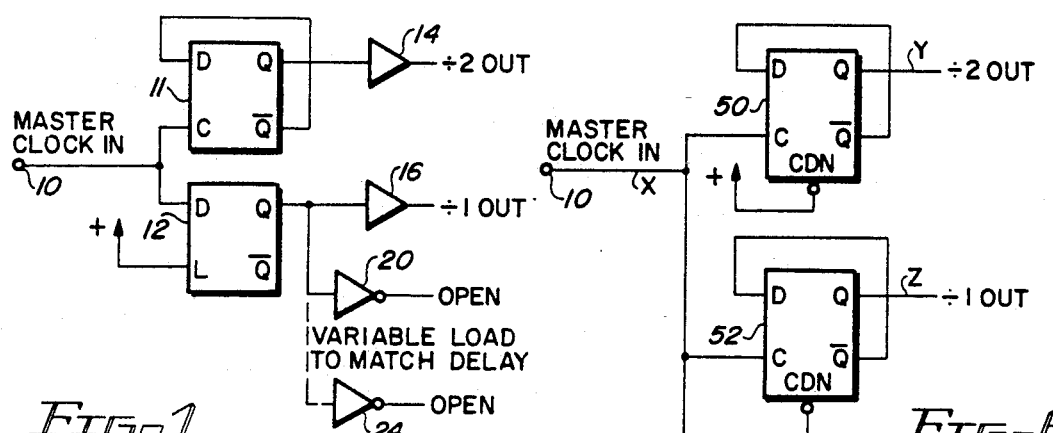
FIG. 1 (PRIOR ART)
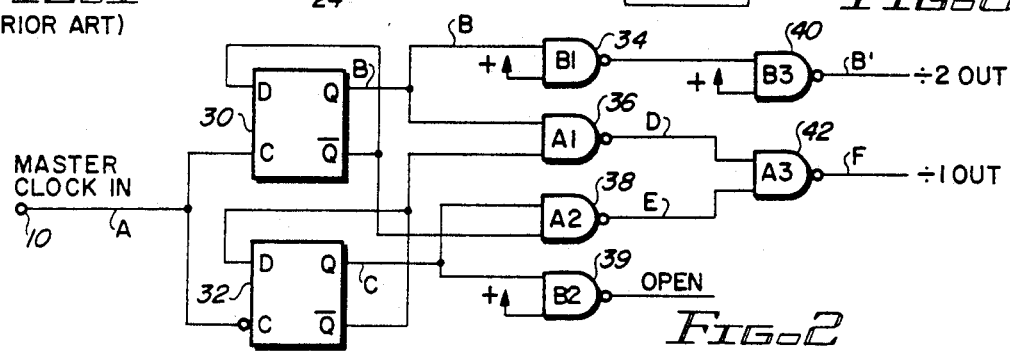
FIG. 6
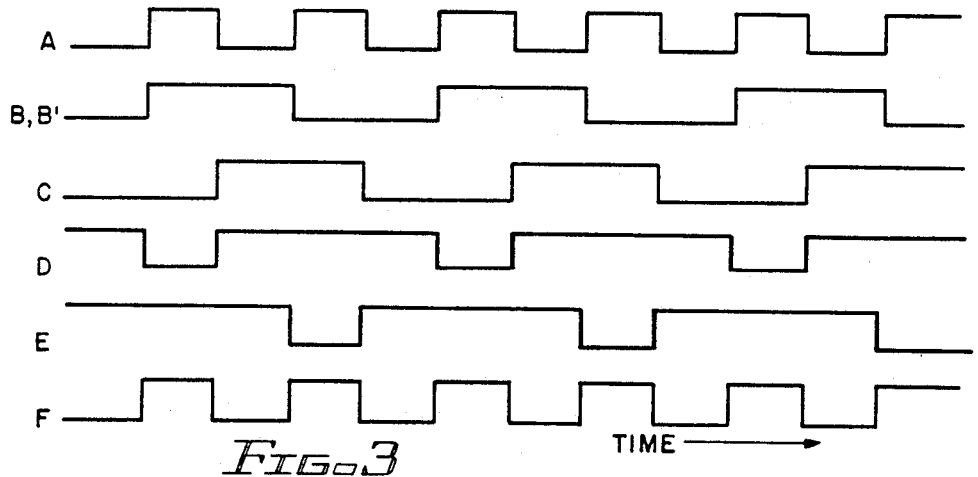
FIG. 2
FIG. 3
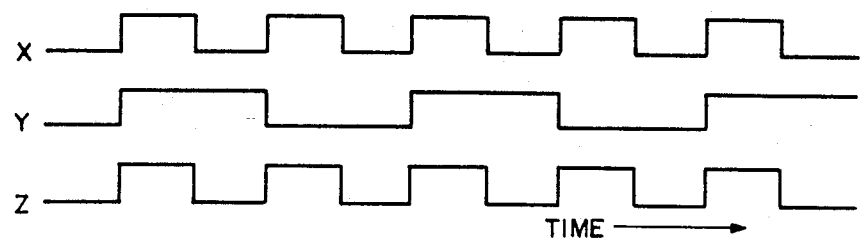
FIG. 7

LOW SKEW CMOS CLOCK DIVIDER

BACKGROUND

Several applications exist, in personal computers and other systems, for a circuit which provides a divide-by-two output from the internal clock of the computer which accurately tracks an undivided clock signal without skew between the two signals. Thus, the rising edges (and, preferably, also the trailing edges) of the signal from the divide-by-two circuit coincides with the corresponding rising edges (and trailing edges) of signals at the frequency of the clock, as applied to circuitry within the system driven by the two different signals.

In the past, to provide a simultaneous divide-by-one and divide-by-two clock output from a master source clock, with less than 0.5 nanoseconds between resulting edges of the respective signals, the master clock has been applied to a "D" type flip-flop externally wired as a divide-by-two device, and to a similarly constructed latch wired to directly pass through the master clock signal. The reason for using the second latch for passing through the master clock to provide the divide-by-one output is an attempt to match the circuit paths for the signals. This is done so that processing variations are nearly identical for both circuit paths, with the resultant outputs ideally coinciding with one another (that is, without skew). In reality, however, the output of the divide-by-one latch is skewed with respect to the divide-by-two flip-flop. To compensate for this, the divide-by-one output is connected to one or more inverters, the outputs of which are unconnected or "open". These inverters operate to provide a capacitive load on the output of the divide-by-one latch to match the delays in this flip-flop with those of the divide-by-two flip-flop for one process and one set of process parameters. A problem which exists, however, is that when the circuit is subjected to variations in operating parameters, such as operating temperatures, the amount of skew varies considerably; so that elimination of skew requires specific tuning or adjustment of the circuitry in the operating environment. Frequently, this cannot be done; and even if such adjustments are possible, the necessity for new adjustments, as conditions change, constantly is necessary.

It is desirable to provide a CMOS clock divider circuit which is designed so that the divide-by-one and divide-by-two circuit paths automatically inherently track one another, substantially reducing skew between the two signals.

SUMMARY OF THE INVENTION

It is an object of this invention to provide an improved clock signal divider circuit.

It is another object of this invention to provide an improved CMOS clock signal divider circuit.

It is an additional object of this invention to provide an improved low skew CMOS clock divider circuit.

It is a further object of this invention to provide an improved low skew CMOS clock divider circuit in which the circuit paths are substantially matched to one another.

In a preferred embodiment of the invention, a low skew clock divider, responsive to a master clock for producing signals at the output of the master clock frequency and signals of the master clock frequency divided by two, is formed by employing two identical flip-flops responsive to the master clock input signals. Both of the flip-flops are externally wired for a divide-by-two division, with one of the flip-flops wired to respond to negative edge clocking while the other responds to positive edge clocking from the master clock signal. Matched gates are connected to the outputs of the flip-flops to combine the out of phase outputs back together to produce the desired divide-by-two and divide-by-one signals. Since the flip-flops essentially are matched and the gates are matched, the clock delays through the flip-flops and gates are very similar, and cause the output signals to track irrespective of variations in process, temperature and the like.

BRIEF DESCRIPTION OF THE DRAWINGS

FIG. 1 is a schematic diagram of a prior art CMOS clock divider circuit;

FIG. 2 is a schematic diagram of a preferred embodiment of the invention;

FIG. 3 is a timing diagram showing the operation of the circuit of FIG. 2;

FIG. 6 is a diagram of an alternative embodiment of the invention;

FIG. 7 is a timing diagram useful in explaining the operation of the circuit of FIG. 6.

DETAILED DESCRIPTION

Figure 4:
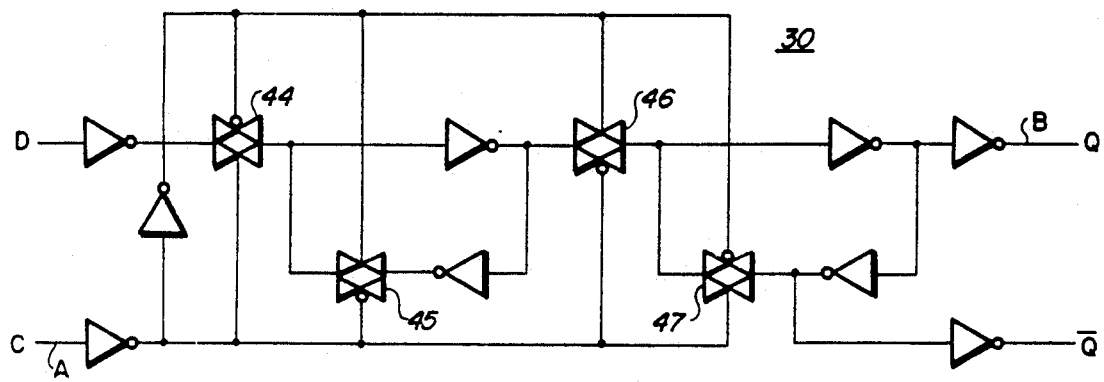
FIGS. 4 and 5 are detailed schematic diagrams of portions of the circuit of FIG. 2.

Reference now should be made to the drawings, in which the same reference numbers are used in the different figures to designate the same components.

FIG. 1 shows a typical prior art circuit used to provide simultaneous divide-by-one and divide-by-two clock outputs from a master clock source. As illustrated in FIG. 1, the master clock signals are applied to an input terminal 10. These signals are applied, respectively, to the "C" and "D" inputs of a flip-flop 11 and latch 12. The flip-flop 11 is a "D" type flip-flop externally wired with the "QN" (inverted) output connected to the "D" input to cause the "Q" (normal) output to constitute a divide-by-two output signal representation of the clock signal applied to the input terminal 10. This divide-by-two output is supplied from the Q output through an amplifier 14 for connection to a suitable load.

In an effort to provide matching of the delay encountered through the flip-flop 11, the latch 12 is operated essentially as an open gate by connecting the "L" input directly to the source of +VDD voltage. As is well known, the latch 12 then directly passes the clock signals applied to the terminal 10 through to its "Q" output, but with a delay resulting from the delays inherent in the internal construction of the latch.

It has been found, however, that matching to the flip-flop is not accurate. For this reason, one or more open inverters 20 to 24 are connected in parallel with one another across the amplifier 16 connected to the "Q" output of the flip-flop 12. The number of open circuited inverters 20, which are connected in this manner, is selected to provide the necessary capacitive load for the latch 12 to match the delay of the signals passing through the upper divide-by-two flip-flop 11. The problem with the circuit of FIG. 1 is that whenever temperature changes occur, or other process variations exist, the number of the inverters 20 comprising the capacitive load must be varied in order to maintain the desired match. This is difficult to do. Consequently, in many cases significant skew exists between the outputs of the flip-flop 11 and latch 12; so that the desired tracking of the divide-by-one and divide-by-two outputs does not exist, except for the pre-established system conditions.

The circuit of FIG. 2 has been developed to replace the prior art circuit shown in FIG. 1 and described above. In the circuit of FIG. 2, a pair of "D" flip-flops 30 and 32 are provided to produce the desired output clock signals. These flip-flops are identical to one another, with the exception that the flip-flop 32 is internally wired for negative edge clocking, while the flip-flop 30 is wired for positive edge clocking. This is indicated in FIG. 2 by the symbols on the clock input "C" for both of the flip-flops. The master clock signals 10 are supplied in parallel to these clock inputs for the flip-flops 30 and 32. Both of the flip-flops 30 and 32 also are wired externally as divide-by-two counters by connecting the "QN" output to the "D" input.

To produce the divide-by-one and divide-by-two output signals, a set of matched two-input NAND gates 34, 36, 38 and 39 are provided. One of the two inputs of the NAND gates 34 and 39 is permanently connected to the positive VDD potential. These gates then are connected to the "Q" outputs of the flip-flops 30 and 32, respectively. The output of the NAND gate 34 is supplied as one input to a second NAND gate 40, the other input to which is permanently tied to +VDD to produce the divide-by-two signal at the output of the NAND gate 40.

Production of the divide by-one output is effected by means of the NAND gates 36 and 38, to which the "Q" outputs of the flip-flops 30 and 32, respectively, are applied as one of the two inputs. The other input to the NAND gate 36 is the "QN" output of the flip-flop 32, while the second input to the NAND gate 38 is the "QN" output of the flip-flop 30. The two outputs of the gates 36 and 38 are supplied to the two inputs of a NAND gate 42, the output of which constitutes the divide-by-one output signal.

The fourth NAND gate 39 has its output open circuited, as illustrated in FIG. 2. This NAND gate and the connections from the "Q" output of the flip-flop 32 may be eliminated; but it provides an optional load matching to cause the "Q" output of the flip-flop 32 to be loaded in a manner similar to the loading on the "Q" output of the flip-flop 30. The NAND gate 39, however, may be eliminated without substantially adversely affecting the operation of the circuit.

Reference should be made to FIG. 3. This figure shows the different signal waveforms which appear at the corresponding letter points in FIG. 2. As is readily apparent from an examination of FIG. 3, the clock signal waveform A causes transitions in the "Q" output of the flip-flop 30 to occur on each positive-going signal transition of the waveform A. Because the flip-flop 32 is internally wired to respond to the negative going transitions of the clock signal, the waveform C on the "Q" output of the flip-flop 32 is out of phase with the waveform B, as illustrated. When the "Q" output of the flip-flop 30 and the "QN" output of the flip-flop 32 are combined in the NAND gate 36, the waveform D is the result. Similarly, the combination of the "Q" output of the flip-flop 32 with the "QN" output of the flip-flop 30 in the NAND gate 38 causes the waveform E to result. When the two signals D and E are combined in the NAND gate 42, the divide-by-one waveform F results.

By comparing this waveform with the waveform B' of FIG. 3, it can be seen that the signal transitions in the two waveforms are aligned with one another. This actually occurs in practice since the clock signals on the terminal 10 which pass through both the divide-by-two portion of the circuit and the divide-by-one portion of the circuit, each traverse the same number of similar circuit components prior to appearing on the outputs of the NAND gates 40 and 42.

Figure 5:
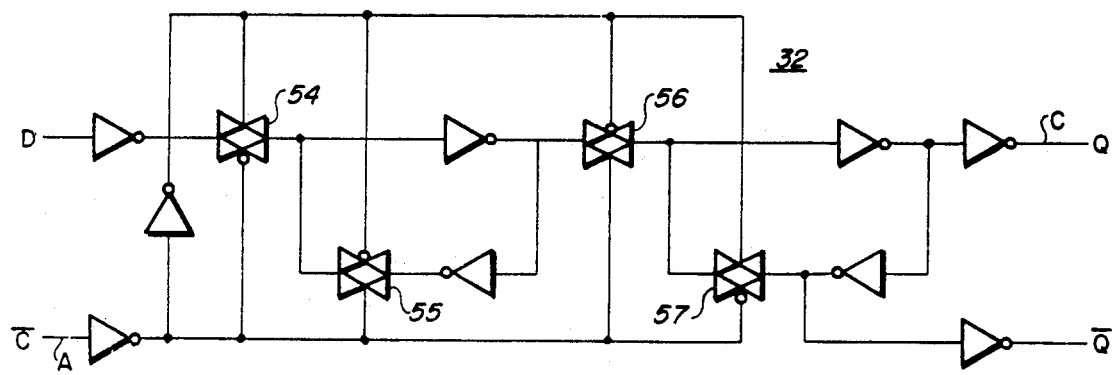

FIGS. 4 and 5 show the internal wiring details of the flip-flops 30 and 32, respectively. The symbols used in FIGS. 4 and 5 are conventional CMOS circuit symbols. The primary components of each of the flip-flops 30 and 32 are four CMOS transmission gates constituting the gates 44, 45, 46 and 47 for the flip-flop 30, and constituting the gates 54, 55, 56 and 57 for the flip-flop 32. These gates are interconnected with the "C" and "D" inputs of the flip-flops by means of various CMOS inverter circuits in the configuration illustrated; and the "Q" and "QN" outputs are obtained from final inverter stages, as illustrated in FIGS. 4 and 5.

It should be noted that the internal configurations of the two flip-flops 30 and 32 are identical insofar as the circuit components are concerned. The difference between the two flip-flops is that the transmission gates 54, 55, 56 and 57 of the flip-flop 32 all are reversed from the gates 44, 45, 46 and 47 of the flip-flop 30. This is indicated by the circular dots on one side of each of the gates of the respective flip-flops, indicative of the gate to the P channel transistor in each of the transmission gates. The N channel transistor in the gates 44 to 47 and 54 to 57 is shown as connected directly to the corresponding output of the particular inverter circuit which drives that gate.

The internal circuit details of the inverters of the flip-flops 30 and 32, and of the transmission gates 44 to 47 and 54 to 57, have not been shown, since these circuits are conventional circuits. The circuits of FIGS. 4 and 5, however, are illustrated for the purpose of showing the identical circuit paths through which the signals applied to the inputs of the transistors follow before appearing on the outputs. Obviously, when the transistors 30 and 32 are processed on the same integrated circuit chip, this causes any variations in processing to be inherently produced in both of the flip-flops 30 and 32. Similarly, temperature variations, which may cause variations in the delay or propagation time of signals passing through the flip-flops, are produced identically in both of the flip-flops 30 and 32; so that accurate tracking of the signals occurs. When the NAND gates 34, 36, 38, 40 and 42 (and 39 when this optional gate is used) also are produced on the same integrated circuit chip, the variations in processing and variations in operating parameters such as temperature, which occur in use of the circuit, cause the same variations in signal delay of signals passing through the respective gates. Thus, the final outputs of the NAND gates 40 and 42 accurately track one another. As a result, skew between the divide-by-one and divide-by-two signals is significantly reduced, substantially enhancing the applicability of the clock divider circuit in use in the systems with which it is employed.

It is important for accurate tracking of the divide-by-one and divide-by-two signals that the NAND gates 34, 36, 38, (and 39 where it is used) and 40, 42 should be matched to one another. This produces a better match in the delay paths of the signals passing through the system to the indicated outputs of the NAND gates 40 and 42. The loading of the "Q" outputs of the flip-flops is equal (particularly when the optional NAND gate 39 is used) as is the loading of the "QN" outputs. Clearly, in order to maintain low skew between the divide-by-one and divide-by-two outputs on the gates 40 and 42, these outputs should be loaded equally. When this is done, accurate tracking of the divide-by-one and divide-by-two signals occurs with significantly lower skew than is experienced with the prior art circuits of the type shown in FIG. 1.

FIG. 6 is an alternative low skew clock circuit, which may be used in place of the circuit of FIG. 2. In the circuit of FIG. 6, a pair of flip-flops 50 and 52 are provided with an active-low clear on a slave latch for both the divide-by-two and divide-by-one paths of the flip-flops 50 and 52, respectively. For the divide-by-two flip-flop 50, the clear input is permanently tied to a source of +VDD potential. For the flip-flop 52, the clear input is connected in parallel with the clock input; so that signals applied to the clock input of the flip-flop 52 pass through the flip-flop essentially unchanged to appear on its "Q" output. These signals appearing on the "Q" output of the flip-flop 52, however, are imparted with a delay which matches the delay of the signals which are processed by the divide-by-two flip-flop 50; so that low skew or tracking of the divide-by-one and divide-by-two signals takes place.

Figure 8:
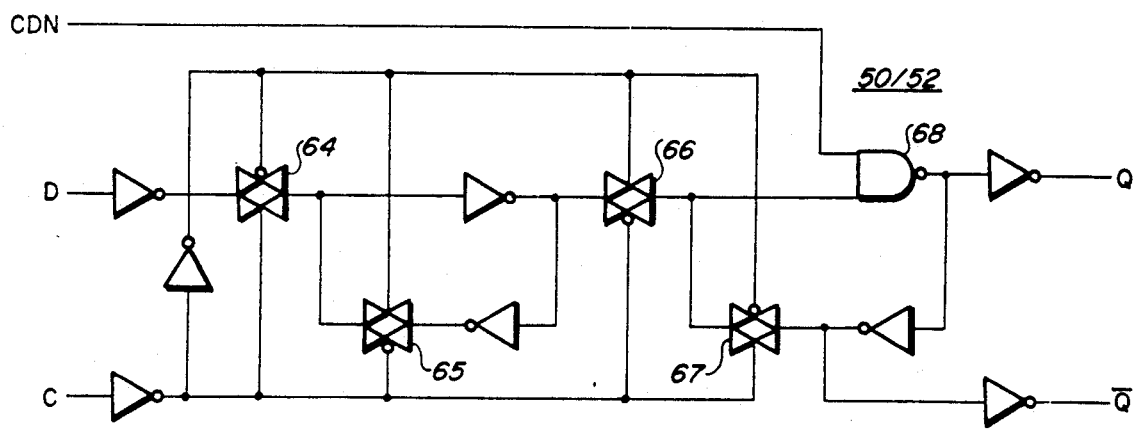
FIG. 8 is a detailed schematic diagram of circuit elements of the embodiment of FIG. 6.

FIG. 8 shows the internal details of the flip-flops 50 and 52; and it is apparent that the configuration of these flip-flops is similar to the ones shown in FIGS. 4 and 5, with the exception of the addition of an internal NAND gate 68 which replaces a corresponding inverter in the flip-flops 30 and 32. The flip-flops 50 and 52 each include four transmission gates 64, 65, 66 and 67, which are comparable to the transmission gates 44 through 47, respectively, of the flip-flop 30. The outputs of the transmission gates 66 and 67, however, are connected in parallel together to the lower input of the NAND gate 68. The upper input of the NAND gate 68 is the CDN or clear-bar input. Consequently, the signals appearing on the "Q" output of the flip-flop depend on the nature and timing of the signals on the CDN input. When this input is tied to an active high, as with the flip-flop 50, it is readily apparent that the clock signals applied to the clock input "C" of the flip-flop (wired externally as shown in FIG. 6) result in a divide-by-two output. When the upper input (CDN) to the NAND gate 68 is tied in parallel to the clock signal input on the input "C" the resultant is a divide-by-one signal on the "Q" output for the flip-flop 52.

FIG. 7 is a waveform showing the signals which appear at points X, Y and Z, respectively, of FIG. 6. The waveform X constitutes the input clock signal, while the waveforms Y and Z constitute the divide-by-two and divide-by-one signals, respectively. The signals Y and Z accurately track one another, and are delayed by substantially the same amounts from the input signals X applied to the clock input signal terminal 10.

The foregoing description of the preferred embodiments of the invention is to be considered illustrative, and not as limiting.

Various changes and modifications will occur to those skilled in the art, without departing from the true scope of the invention as defined in the appended claims.

We claim:

1. A low-skew clock divider circuit including in combination:

a source of clock pulses at a predetermined frequency;

first and second flip-flop circuit means fabricated with matched components and wired as divide-by-two circuits, each of said first and second flip-flops having a clock input terminal;

means for coupling said source of clock impulses with the clock input terminals of said first and second flip-flops; and coincidence gate means coupled with said first and second flip-flops for providing divide-by-two and divide-by-one outputs therefrom.

2. The combination according to claim 1 wherein said first and second flip-flop circuits are externally wired as divide-by-two circuits.

3. The combination according to claim 2 wherein said first and second flip-flop circuit means comprise D-type flip-flops, each having a "D" input and normal and inverted output terminals, with the inverted output terminal of each of said first and second flip-flops coupled with the "D" input thereof.

4. The combination according to claim 3 wherein said source of clock pulses is a source of squarewave pulses, and said first flip-flop circuit means is internally wired to respond to the positive going edges of said clock pulses, and said second flip-flop circuit means is internally wired to respond to the negative going edges of the squarewave clock pulses from the source of said clock pulses.

5. The combination according to claim 4 wherein said first and second flip-flop circuit means are D-type flip-flops having normal (Q) and inverted (QN) outputs; said coincidence gate means comprises a first set of first, second and third coincidence gate means and a second set of fourth and fifth coincidence gate means, each of said coincidence gate means having an output on a plurality of inputs, with the normal output of said first flip-flop circuit means coupled with a first input of said first and second coincidence gate means, and the inverted output of said first flip-flop circuit means coupled with an input to said third coincidence gate means, the normal output of said second flip-flop circuit means connected with an input to said third coincidence gate means and the inverted output of said second flip-flop circuit means coupled with an input to said second coincidence gate means; and the outputs of said second and third coincidence gate means comprise inputs to said fifth coincidence gate means to produce a divide-by-one input at said predetermined frequency and the output of said fourth coincidence gate means comprises said divide-by-two output.

6. The combination according to claim 5 wherein said first and fourth coincidence gate means each have an input thereto coupled to a source of direct current potential.

7. The combination according to claim 6 wherein said first, second, third, fourth and fifth coincidence gate means each comprise two input gates.

8. The combination according to claim 7 wherein said first, second, third, fourth and fifth coincidence gates comprise NAND gates.

9. The combination according to claim 2 wherein said coincidence gate means comprises an internal coincidence gate.

10. The combination according to claim 9 wherein said first and second flip-flops each additionally have a clear input terminal coupled to one of the inputs of said coincidence gate, with said clear input terminal for said second flip-flop coupled in common with the clock input terminal thereof, and with said clear input terminal of said first flip-flop coupled with a source of fixed potential.

11. The combination according to claim 10 wherein said coincidence gate is a NAND gate and said source of fixed potential is a source of positive potential.

12. The combination according to claim 1 wherein said coincidence gate means comprises an internal coincidence gate.

13. The combination according to claim 1 wherein said first and second flip-flop circuit means are D-type flip-flops having normal (Q) and inverted (QN) outputs; said coincidence gate means comprises a first set of first, second and third coincidence gate means and a second set of fourth and fifth coincidence gate means, each of said coincidence gate means having an output on a plurality of inputs, with the normal output of said first flip-flop circuit means coupled with a first input of said first and second coincidence gate means, and the inverted output of said first flip-flop circuit means coupled with an input to said third coincidence gate means, the normal output of said second flip-flop circuit means connected with an input to said third coincidence gate means and the inverted output of said second flip-flop circuit means coupled with an input to said second coincidence gate means; and the outputs of said second and third coincidence gate means comprise inputs to said fifth coincidence gate means to produce a divide-by-one input at said predetermined frequency and the output of said fourth coincidence gate means comprises said divide-by-two output.

14. The combination according to claim 1 wherein said source of clock pulses is a source of squarewave pulses, and said first flip-flop circuit means is internally wired to respond to the positive going edges of said clock pulses, and said second flip-flop circuit means is internally wired to respond to the negative going edges of the squarewave clock pulses from the source of said clock pulses.

15. The combination according to claim 14 wherein said first and second flip-flop circuit means comprise D-type flip-flops, each having a "D" input and normal and inverted output terminals, with the inverted output terminal of each of said first and second flip-flops coupled with the "D" input thereof.

* * * * *